US008653905B2

(12) United States Patent
Ryu et al.

(10) Patent No.: US 8,653,905 B2
(45) Date of Patent: Feb. 18, 2014

(54) HIGH-VOLTAGE WIDEBAND PULSE ATTENUATOR HAVING ATTENUATION VALUE SELF-CORRECTION FUNCTION

(75) Inventors: Seung Kab Ryu, Daejeon (KR); Kyung Hoon Lee, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 451 days.

(21) Appl. No.: 13/167,894

(22) Filed: Jun. 24, 2011

(65) Prior Publication Data

US 2012/0086528 A1 Apr. 12, 2012

(30) Foreign Application Priority Data

Oct. 11, 2010 (KR) ........................ 10-2010-0098746

(51) Int. Cl.
*H03H 7/24* (2006.01)

(52) U.S. Cl.
USPC .......................................... 333/81 A; 333/263

(58) Field of Classification Search
USPC ...................................... 333/81 A, 17.3, 263
See application file for complete search history.

(56) References Cited

U.S. PATENT DOCUMENTS

| | | | |
|---|---|---|---|
| 3,665,347 | A | 5/1972 | Barth |
| 6,456,094 | B2 | 9/2002 | Kuperman et al. |

FOREIGN PATENT DOCUMENTS

| | | | |
|---|---|---|---|
| JP | 3589984 | B2 | 8/2004 |
| KR | 10-1998-0007664 | A | 3/1998 |
| KR | 10-2000-0028507 | A | 5/2000 |
| KR | 10-0642321 | B1 | 11/2006 |
| WO | 03/061058 | A1 | 7/2003 |

OTHER PUBLICATIONS

Jin-Liang Liu et al., “Coaxial Capacitive Dividers for High-Voltage Pulse Measurements in Intense Electron Beam Accelerator With Water Pulse-Forming Line”, IEEE Transactions on Instrumentation and Measurement. vol. 58, No. 1, Jan. 2009.

*Primary Examiner* — Stephen Jones
(74) *Attorney, Agent, or Firm* — LRK Patent Law Firm

(57) ABSTRACT

Provided is a high voltage wideband pulse attenuator having an attenuation value self-correction function. The high voltage wideband pulse attenuator includes an input unit for receiving a pulse signal, a T-shaped attenuator circuit for attenuating the pulse signal, an output unit for outputting the pulse signal attenuated by the attenuator circuit, and a capacitive divider circuit for dividing a voltage of the pulse signal input through the input unit or the pulse signal attenuated by the attenuator circuit. Using the capacitive divider circuit, the high voltage wideband pulse attenuator can easily measure an error of an attenuation value caused by a change in the resistance of T-shaped array resistor units in a process of attenuating an input pulse signal of tens of kV or more. In particular, the pulse attenuator can measure its performance by itself without test assisting devices, and check a state of an attenuated pulse in real-time.

12 Claims, 4 Drawing Sheets

HIGH-VOLTAGE WIDEBAND PULSE ATTENUATOR HAVING ATTENUATION VALUE SELF-CORRECTION FUNCTION

CROSS-REFERENCE TO RELATED APPLICATION

This application claims priority to and the benefit of Korean Patent Application No. 10-2010-0098746, filed Oct. 11, 2010, the disclosure of which is incorporated herein by reference in its entirety.

BACKGROUND

1. Field of the Invention

The present invention relates to a high voltage wideband pulse attenuator, and more particularly to a high-voltage wideband pulse attenuator having an attenuation value self-correction function.

2. Discussion of Related Art

Recently, needs for a high-voltage pulse generator having a peak voltage of tens of kV, a FWHM (Full Width Half Maximum) of several nanoseconds or less, and a pulse repetition frequency of several kHz or less has been increasing, resulting in a need for an apparatus for measuring an output waveform of such a high-voltage pulse generator. However, a probe provided by a conventional high-speed wideband oscilloscope has a limitation in measuring an output waveform of a high-voltage nanosecond pulse generator, and thus an attenuator for attenuating a pulse signal is required.

A high-voltage wideband pulse signal has a time-limited characteristic that a peak voltage of a pulse and a pulse width are tens of kV and several ns or less in a time domain, and a characteristic of an unlimited spectrum in a frequency domain. To attenuate such a high-voltage wideband pulse signal, both of the following two conditions should be satisfied.

First, an attenuator should have an impedance matching characteristic at least in a first null bandwidth $BW_{First\text{-}null}$ of Equation 1 below. Needless to say, an ideal pulse attenuator would achieve impedance matching in a whole frequency band, which is impossible to realize. Thus, by satisfying the impedance matching characteristic at least in the first null bandwidth, it is possible to prevent a pulse generator from being deteriorated by a reflected pulse.

$$BW_{First\text{-}null} = \frac{1}{t_r} \quad \text{[Equation 1]}$$

Here, $t_r$ denotes a rise time.

Second, insulation performance for a high-voltage wideband pulse signal should be satisfied. In other words, an attenuator should be able to prevent insulation breakdown from being caused by a high-voltage wideband pulse signal.

However, there is a trade-off relationship between the two conditions, and conventional attenuators cannot satisfy both of the two conditions. More specifically, to obtain an excellent frequency characteristic, a resistance unit of an attenuator circuit should be physically so small that a resistance characteristic is not lost due to stray inductance or stray capacitance. On the other hand, to attenuate a high-voltage wideband pulse signal without insulation breakdown, the interval between electrodes of the resistance unit should be large. As a result, when the interval between electrodes of the resistance unit is increased to prevent insulation breakdown, the frequency characteristic of the attenuator deteriorates.

Meanwhile, the resistance unit used in the attenuator circuit for attenuating a high-voltage wideband pulse signal may be exposed to high energy, and properties of the resistance unit may be changed. Thus, it is necessary to examine characteristics of the resistance unit before and after a high voltage pulse test. However, conventional measurement of characteristics of the resistance unit requires other test assisting devices, cables, etc., and thus is inconvenient.

A structure and problem of a conventional pulse attenuator and a conventional capacitive divider circuit will be described in detail below.

FIG. 1 is a cross-sectional view of a conventional T-shaped resistive attenuator.

As shown in the drawing, a conventional T-shaped resistance attenuator 200 has a coaxial structure employing a stick resistor R made of a combination of a ceramic material and a metallic film material. Since the resistor R has a long physical length, it is not regarded as a lumped element at GHz frequency band. Thus, by exponentially reducing a coaxial external diameter, stray inductance and stray capacitance of the stick resistor R cancel each other, so that the stick resistor R can operate as a resistor. Here, the stick resistor R does not have small resistance and has a large breakdown voltage for a high-voltage pulse. Thus, the stick resistor R is useful in attenuating a high-voltage signal.

However, it is difficult to insulate a central electrode from the T-shaped stick resistor R. More specifically, a breakdown voltage of each unit length (mm) differs greatly according to the dielectric quality of a coaxial line, but a breakdown voltage of a dielectric surface is several kV or less per millimeter (mm). When the T-shaped central electrode and an oval case grounding structure 10 are close to each other, insulation breakdown is occurred by an incident high-voltage pulse of tens of kV or more along the dielectric surface. Thus, the T-shaped resistive attenuator 100 is not appropriate for attenuating a high-voltage pulse of tens of kV.

FIG. 2 is a cross-sectional view of a conventional capacitive divider.

As shown in the drawing, in a conventional capacitive divider 200, a U-shaped electrode 20 is inserted between a pulse output line and the ground to implement a pulse divider circuit. Herein, the pulse divider circuit divide voltage by a series structure of a capacitance C1 formed between a ground 21 and the U-shaped electrode 20 and a capacitance C2 formed between a coaxial line 23 and a U-shaped electrode 20. Thus, an impulse output of hundreds of kV in a pulse forming line of an intense electron beam accelerator can be measured with division by several thousands.

In particular, the capacitance C1 formed between the U-shaped electrode 20 and the ground 21 is made to have a value several hundred times to several thousand times that of the capacitance C2 formed between the coaxial line 23 and the U-shaped electrode 20, thereby maintaining an overall capacitance connected in series from the coaxial line 23. Thus, the capacitive divider 200 can be implemented to have a large division ratio without affecting coaxial line characteristic impedance.

However, the conventional capacitive divider is only used to monitor a high-voltage pulse signal in a coupling method, and has a limitation in monitoring a pulse state in real time while attenuating a pulse.

Also, to specify a pulse signal, a test assisting device, a cable, etc. are required. In particular, since an additional capacitive divider should be used, coaxial impedance becomes discontinuous.

Further, to provide a pulse output attenuated to several decibels, the U-shaped electrode 20 should be disposed so close to a coaxial electrode of an output unit in the structure of the conventional capacitive divider that the capacitance C1 formed between the U-shaped electrode 20 and the ground 21 has a similar value to that of the capacitance C2 formed between the coaxial line 23 and the U-shaped electrode 20. However, as the U-shaped electrode 20 and the coaxial electrode of the output unit approach each other, combined capacitance decreases, and output impedance cannot be maintained for 50-ohm.

SUMMARY OF THE INVENTION

The present invention is directed to providing a high-voltage wideband pulse attenuator checking whether or not a resistance unit is deteriorated or destroyed, and capable of measuring an attenuation value by itself without a test assisting device.

One aspect of the present invention provides a high-voltage wideband pulse attenuator including: an input unit for receiving a high voltage pulse signal; a T-shaped resistive attenuation circuit for attenuating the pulse signal; an output unit for outputting the pulse signal attenuated by the attenuator circuit; and a capacitive divider unit for monitoring a divided pulse signal either at the input or output side.

BRIEF DESCRIPTION OF THE DRAWINGS

The above and other objects, features and advantages of the present invention will become more apparent to those of ordinary skill in the art by describing in detail exemplary embodiments thereof with reference to the attached drawings, in which.

DETAILED DESCRIPTION OF EXEMPLARY EMBODIMENTS

Hereinafter, exemplary embodiments of the present invention will be described in detail. However, the present invention is not limited to the embodiments disclosed below but can be implemented in various forms. The following embodiments are described in order to enable those of ordinary skill in the art to embody and practice the present invention. To clearly describe the present invention, parts not relating to the description are omitted from the drawings. Like numerals refer to like elements throughout the description of the drawings.

Figure 1:
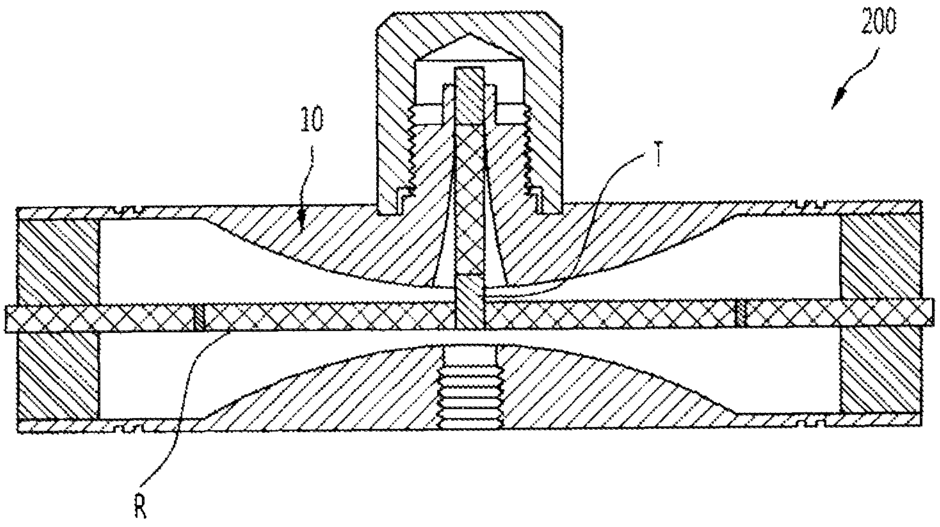
FIG. 1 (PRIOR ART)
FIG. 1 is a cross-sectional view of a conventional T-shaped resistive attenuator.
Figure 2:
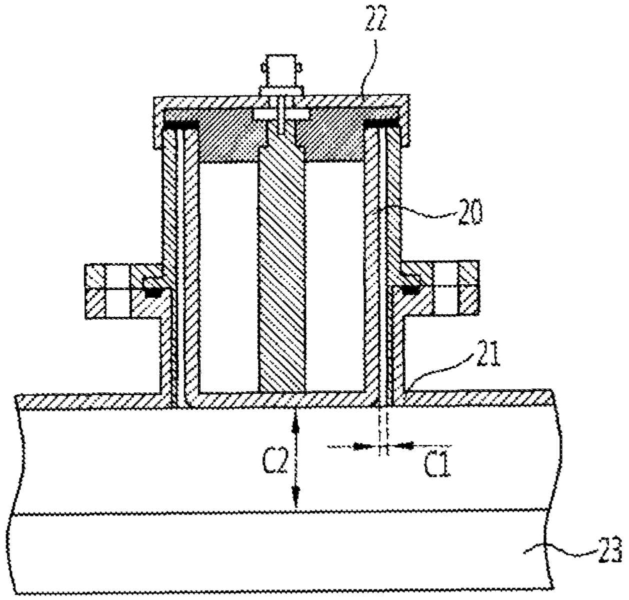
FIG. 2 (PRIOR ART)
FIG. 2 is a cross-sectional view of a conventional capacitive divider.
Figure 3:
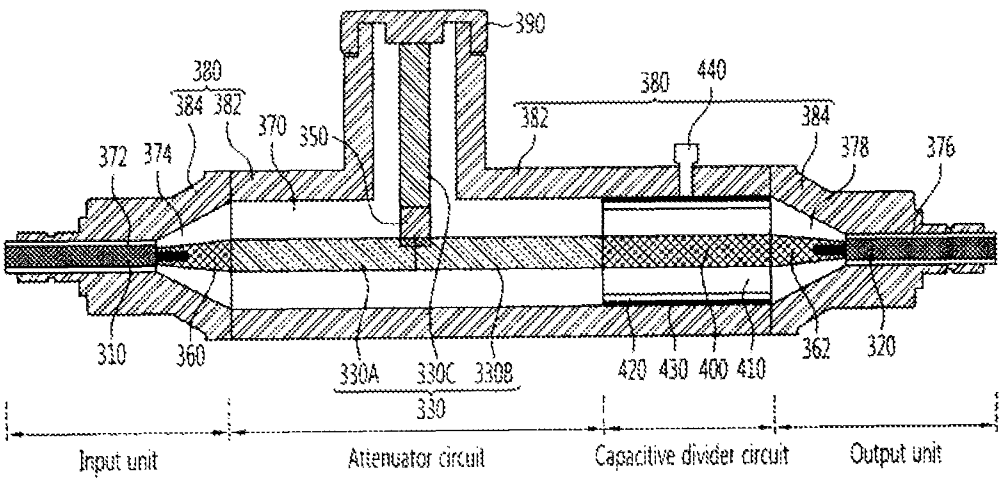
FIG. 3 is a cross-sectional view of a high-voltage wideband pulse attenuator according to an exemplary embodiment of the present invention.

FIG. 3 is a cross-sectional view of a high-voltage wideband pulse attenuator according to an exemplary embodiment of the present invention.

As shown in the drawing, a high-voltage wideband pulse attenuator 300 according to an exemplary embodiment of the present invention includes an input unit to which a pulse signal is incident, a T-shaped attenuator circuit attenuating the pulse signal, a capacitive divider circuit for monitoring a divided pulse signal either at the input or output side.

The input unit includes an input coaxial cable 310 and a first dielectric layer 372 surrounding the input coaxial cable 310. The input coaxial cable 310 includes a cable core and a dielectric layer surrounding the cable core. The first dielectric layer 372 is formed to surround the input coaxial cable 310 and serves to maintain an impedance characteristic of the input coaxial cable 310. The first dielectric layer 372 may have a cylindrical shape. Like the input unit, the output unit includes an output coaxial cable 320 and a first dielectric layer 376 surrounding the output coaxial cable 320. Here, the output coaxial cable 320 may be used as a connector for connecting the attenuator to another apparatus. In this case, the output coaxial cable 320 and the first dielectric layer 376 may be formed to have a punched form and used for spiral combination.

Also, the input unit includes a transformation electrode 360 connecting the input coaxial cable 310 and a resistance unit 330A of the attenuator circuit, and a second dielectric layer 374 surrounding the transformation electrode 360. Likewise, the output unit includes a transformation electrode 362 connecting the output coaxial cable 320 and a resistance unit 330B of the attenuator circuit, and a second dielectric layer 378 surrounding the transformation electrode 362.

The attenuator circuit includes a plurality of resistance units 330A, 330B and 330C arranged in a T-shape, and a third dielectric layer 370 surrounding the resistance units 330A, 330B and 330C. The attenuator circuit further includes a central electrode 350 for connecting the resistance units 330A, 330B and 330C in a T-shape, and the central electrode 350 is supported by the third dielectric layer 370. Also, to improve a contact characteristic between the grounded resistance unit 330C and the central electrode 350, the attenuator circuit may further include copper cotton prepared between the grounded resistance unit 330C and the central electrode 350.

The capacitive divider circuit is prepared between the input unit and the attenuator circuit, or between the attenuator circuit and the output unit. As an example, FIG. 3 shows a case in which the capacitive divider circuit is prepared between the attenuator circuit and the output unit.

Here, the capacitive divider circuit includes a first electrode 400 having an inner coaxial in-line structure together with the input unit, the attenuator circuit, and the output unit, a fourth dielectric layer 410, a second electrode 420 and a fifth dielectric layer 430 sequentially surrounding the first electrode 400, and a connector 440 connected with the second electrode 420 and outputting a pulse signal whose voltage is divided. According to this structure, a capacitance of several pF is formed between the second electrode 420 and a grounded case 382 along the coaxial line of the output unit by the capacitive divider circuit. Thus, a pulse signal is coupled by the capacitive divider circuit to several V to tens of V and output through the connector 440, and it is possible to measure the pulse signal through the connector 440. Here, the connector 440 may be a surface mountable assembly (SMA) connector, and a core of the connector 440 is connected with the second electrode 420.

For example, an input pulse signal can be measured when the capacitive divider circuit is prepared between the input unit and the attenuator circuit, and an attenuated pulse signal can be measured when the capacitive divider circuit is prepared between the attenuator circuit and the output unit.

In addition, the high-voltage wideband pulse attenuator 300 according to an exemplary embodiment of the present invention may further include an external metal case 380 surrounding the input unit, the attenuator circuit, the output unit, and first and second transformation units, and a bulk screw cover 390 for controlling connection between the resistance unit 330C and the central electrode 350.

The external metal case 380 may be formed by joining a plurality of cases 382 and 384 surrounding the dielectric layers 372, 374, 370, 376, 378 and 410. In this case, a commissure of the external metal case 380, and a commissure between the input unit, the attenuator circuit, the output unit, and the first and second transformation units may be formed at different positions.

Here, the second electrode 420 and the fourth dielectric layer 430 of the capacitive divider circuit are interposed between the third dielectric layer 370 and the external metal case 380. Also, the connector 440 of the capacitive divider circuit is connected with the second electrode 420 through the external metal case 380.

The bulk screw cover 390 for controlling connection between the resistance unit 330C and the central electrode 350 is connected with the resistance unit 330C and threadedly engaged with the external metal case 380. By tightening the bulk screw cover 390 clockwise, it is possible to draw the grounded resistance unit 330C close to the central electrode 350.

As described above, the input and output units and the attenuator circuit are implemented in a coaxial structure, so that a characteristic of a breakdown voltage of tens of kV and an impedance matching characteristic can be satisfied. Also, by adding a capacitive divider circuit implemented in the coaxial structure between the input or output unit and the attenuator circuit, the attenuator can measure a change in its performance by itself before and after a high-voltage pulse test without a test assisting device and also check a state of an attenuated pulse in real time during an attenuation test.

In this exemplary embodiment, the input unit and the output unit have been separately described, but are merely relative concepts for convenience of description. When the input unit and the output unit are used in place of each other, a pulse characteristic before and after attenuation can be easily measured. A method of measuring a pulse will be described in detail with reference to FIGS. 8A and 8B.

Figure 4:
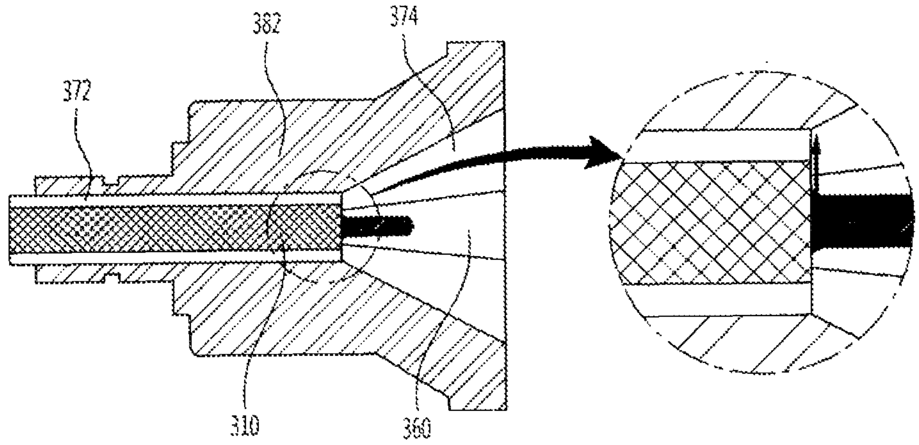
FIG. 4 is a cross-sectional view of an input unit of a high-voltage wideband pulse attenuator according to an exemplary embodiment of the present invention.

FIG. 4 is a cross-sectional view of an input unit of a high-voltage wideband pulse attenuator according to an exemplary embodiment of the present invention.

As shown in the drawing, the input unit has the input coaxial cable 310 having a circular step, and the input coaxial cable 310 has a coaxial in-line structure and includes a cable core and a dielectric layer surrounding the cable core. For example, the input unit can be implemented so that the input coaxial cable 310, which is a 50-ohm coaxial line for high voltage, and the resistance units 330A and 330B of an attenuator circuit have a coaxial structure.

Here, when a commissure of the first dielectric layer 372 and the second dielectric layer 374 is implemented at the same position as a commissure of the input coaxial cable 310 and the transformation electrode 360, a pulse having tens of kV travels in an arrow direction, and insulation breakdown may occur. This is caused by reducing the length of the commissure to maintain coaxial impedance. In an exemplary embodiment of the present invention, the input coaxial cable 310 is formed to have a circular step of a predetermined length or more, so that insulation breakdown can be prevented.

For example, the input coaxial cable 310 manufactured in a cylindrical shape to have a step on its surface and the transformation electrode 360 are connected, and thicknesses of the first dielectric layer 372 and the second dielectric layer 374 are determined so that the sum of the thicknesses satisfies a coaxial 50-ohm impedance condition. Here, the length of the circular step of the input coaxial cable 310 may be calculated for insulation breakdown not to be caused in the first and second dielectric layers 372 and 374 by a pulse breakdown voltage.

The input coaxial cable 310 is connected with the resistance unit 330A of the attenuator circuit, but has a different diameter than the resistance unit 330A. Thus, the input coaxial cable 310 and the resistance unit 330A are connected using the transformation electrode 360, which has a slope on its surface so that impedance does not sharply vary. Using the transformation electrode 360, it is possible to prevent a sudden impedance change and realize 50-ohm impedance.

Figure 5:
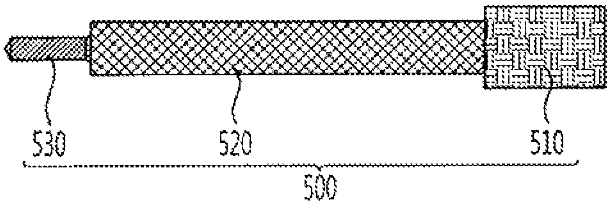
FIG. 5 is a cross-sectional view of a coaxial cable according to an exemplary embodiment of the present invention.

FIG. 5 is a cross-sectional view of a coaxial cable according to an exemplary embodiment of the present invention. As shown in the drawing, a coaxial cable 500 includes a cable core 530 and dielectric layers 510 and 520 surrounding the cable core 530. The dielectric layers 510 and 520 are formed to have a circular step on their surfaces.

Figure 6A:
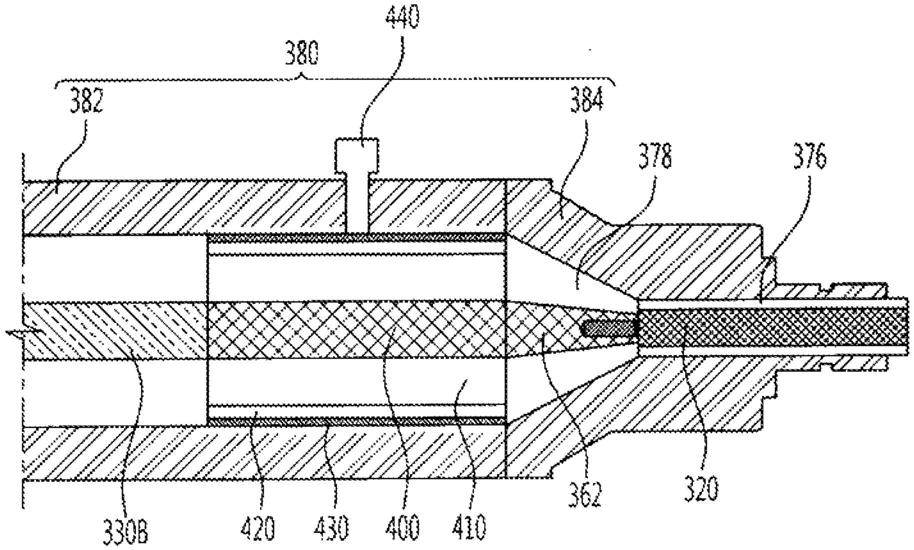
FIGS. 6A and 6B are cross-sectional views of a capacitive divider circuit and an output unit according to an exemplary embodiment of the present invention.
Figure 6B:
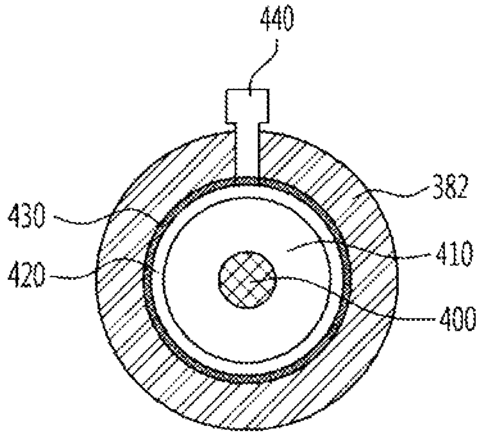
Figure 7:
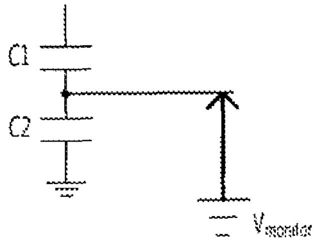
FIG. 7 illustrates a principle of measuring a pulse using a capacitive divider circuit.

FIGS. 6A and 6B are cross-sectional views of a capacitive divider circuit and an output unit according to an exemplary embodiment of the present invention, and FIG. 7 illustrates a principle of measuring a pulse using a capacitive divider circuit.

FIG. 6A is a longitudinal cross-sectional view of a capacitive divider circuit and an output unit, and FIG. 6B is a latitudinal cross-sectional view of the capacitive divider circuit. As shown in the drawings, the capacitive divider circuit has a condenser shape in which the first electrode 400 of the coaxial line is sequentially surrounded by the fourth dielectric layer 410, the second electrode 420 and the fifth dielectric layer 430, and the fifth dielectric layer 430 is surrounded by the external metal case 382. Here, a capacitance C of the capacitive divider circuit can be calculated by Equation 2 below.

$$C = \frac{2\pi\varepsilon_0\varepsilon_r}{\ln(D/d)} \quad \text{[Equation 2]}$$

Here, D denotes an inner diameter of the external metal case 382, d denotes a diameter of the first electrode 400, $\in_0$ denotes the permittivity of the air, and $\in_r$ denotes the permittivity of a dielectric layer.

In the capacitive divider circuit, the capacitance C is divided into a first capacitance C1 and a second capacitance C2 as shown in FIG. 7. Here, the first capacitance C1 is formed by the first electrode 400, the fourth dielectric layer 410, and the second electrode 420, and the second capacitance C2 is formed by the second electrode 420, the fifth dielectric layer 430, and the grounded external metal case 382. Thus, a pulse voltage $V_{monitor}$ measured through the connector 440 using a high-speed oscilloscope satisfies Equation 3 below.

$$V_{monitor} = \frac{X_{C2}}{X_{C1} + X_{C2}} V_{pulse} \quad \text{[Equation 3]}$$

Here, $X_{C1}$ and $X_{C2}$ denote capacitive reactance of the first capacitance C1 and the second capacitance C2 for an input pulse signal. $V_{pulse}$ is voltage amplitude of pulse on the central electrode.

In the capacitive divider circuit according to an exemplary embodiment of the present invention, the smaller the thickness of the fifth dielectric layer 430, the greater the second capacitance C2. Thus, using the capacitive divider circuit, a capacitance of several nF or more can be realized. In this case, the capacitive reactance $X_{C2}$ of the second capacitance C2 decreases, and an output pulse can be measured at a large division ratio. For example, an output pulse can be measured at a division ratio of one to several hundreds or several thousands.

Figure 8A:
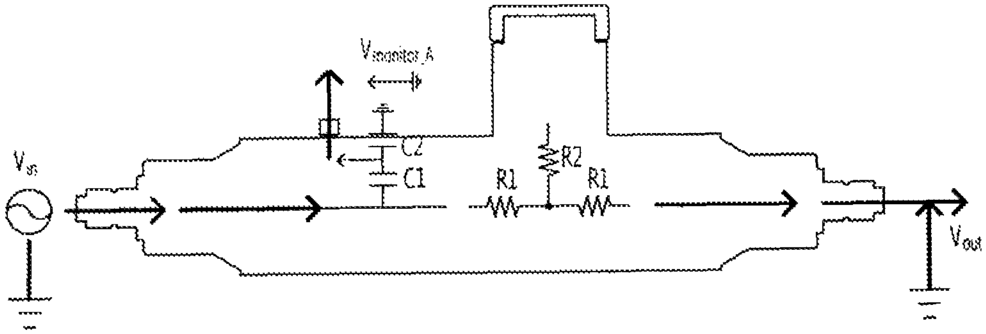
FIGS. 8A and 8B are cross-sectional views of a high-voltage wideband pulse attenuator according to an exemplary embodiment of the present invention illustrating a method for the high-voltage wideband pulse attenuator to measure the amount of attenuation and a method of checking an attenuating operation in real time.

FIGS. 8A and 813 are cross-sectional views of a high-voltage wideband pulse attenuator according to an exemplary embodiment of the present invention illustrating a method for the high-voltage wideband pulse attenuator to measure the amount of attenuation by itself and a method of checking an attenuation operation in real time. For convenience, a structure of the attenuator is briefly shown. In the drawings, denotes an input pulse signal, $V_{out}$ denotes an output pulse signal, and resistance units included in an attenuator circuit are indicated by R1 and R2.

FIG. 8A illustrates a case in which a pulse signal input through an input unit is measured. In other words, a peak voltage $V_{monitor\_A}$ is measured using a capacitive divider circuit before the input pulse signal is passed through the attenuator circuit.

Figure 8B:
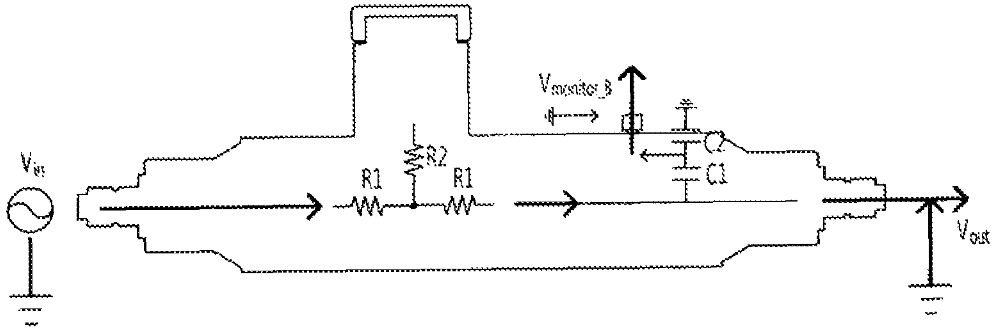

FIG. 8B illustrates a case in which a pulse signal attenuated by the attenuator circuit is measured. In other words, a peak voltage $V_{monitor\_B}$ of the attenuated pulse signal is measured using the capacitive divider circuit.

Here, a single high voltage wideband pulse attenuator with a capacitive divider provides convenience to check an attenuation value for every different incident pulses by means of simply exchanging a position of divider either input side or output side with an optional function of real-time monitoring. In other words, while the pulse signal is attenuated by the attenuator, it is possible to easily measure the peak voltages $V_{monitor\_A}$ and $V_{monitor\_B}$ of the pulse signal before and after the attenuation.

Also, by calculating a difference between the measured peak voltages $V_{monitor\_A}$ and $V_{monitor\_B}$ an attenuation value of the attenuator circuit can be checked. Here, to prevent an error from being caused by a reflected pulse for test environments, a wideband 50 ohm termination load having enough insulation via output voltage pulse should be connected to the output of the attenuator. In this way, it is possible to compare pulse signals obtained before and after attenuation. Thus, the attenuator can measure the amount of attenuation by itself, and check an attenuating operation in real time to monitor whether or not the attenuator itself is deteriorated in real time.

In another exemplary embodiment, a plurality of pulse attenuators according to an exemplary embodiment of the present invention are connected in cascaded stages, and an attenuator in which a capacitive divider circuit is embedded is prepared between an output unit of a pulse generator and an attenuator and between an output unit of an attenuator and a measuring scope. Thus, amplitude of voltage pulse out from an output of the cascaded attenuators is small enough to be measured with commercial oscilloscope, and then possible to measure the absolute voltage value of a pulse.

An exemplary embodiment of the present invention provides a pulse attenuator including a capacitive divider circuit which divides a voltage of an input pulse signal or an attenuated pulse signal. Thus, using the capacitive divider circuit, it is possible to easily measure an error of an attenuation value caused by a change in the resistance of a resistor unit in a process of attenuating an input pulse signal of tens of kV or more. In particular, the pulse attenuator can measure its performance by itself without a test assisting device, and check a state of an attenuated pulse in real time.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A high voltage wideband pulse attenuator having an attenuation value self-correction function, comprising:
- an input unit for receiving a pulse signal;
- a T-shaped attenuator circuit for attenuating the pulse signal;
- an output unit for outputting the pulse signal attenuated by the attenuator circuit; and
- a capacitive divider circuit for dividing a voltage of the pulse signal input through the input unit or the pulse signal attenuated by the attenuator circuit.

2. The high voltage wideband pulse attenuator of claim 1, wherein the capacitive divider circuit is disposed between the input unit or the output unit and the T-shaped attenuator circuit.

3. The high voltage wideband pulse attenuator of claim 1, wherein the capacitive divider circuit includes:
- a first electrode having a coaxial in-line structure together with the input unit, the attenuator circuit, and the output unit;
- a fourth dielectric layer, a second electrode, and a fifth dielectric layer sequentially surrounding the first electrode; and
- a connector connected with the second electrode.

4. The high voltage wideband pulse attenuator of claim 1, wherein the capacitive divider circuit is disposed between the input unit and the attenuator circuit, and divides the voltage of the pulse signal input through the input unit.

5. The high voltage wideband pulse attenuator of claim 1, wherein the capacitive divider circuit is disposed between the attenuator circuit and the output unit, and divides the voltage of the pulse signal attenuated by the attenuator circuit.

6. The high voltage wideband pulse attenuator of claim 1, wherein the pulse signal is measured at input and output sequentially through the capacitive divider circuit, output unit is used as the input unit to measure the pulse signal obtained before and after the pulse signal is attenuated using the one attenuator.

7. The high voltage wideband pulse attenuator of claim 1, wherein the attenuator circuit includes a plurality of resistance units arranged in a T-shape and having a coaxial in-line structure together with the input unit and the output unit, and an end of each resistance units is grounded.

8. The high voltage wideband pulse attenuator of claim 7, wherein the attenuator circuit further includes:
- a third dielectric layer surrounding the plurality of resistance units; and
- a central electrode connecting the plurality of resistance units in a T-shape.

9. The high voltage wideband pulse attenuator of claim 8, further includes:

copper cotton prepared between the central electrode and the grounded resistance unit; and a cover connected with the grounded resistance unit and controlling connection between the grounded resistance unit and the central electrode.

10. The high voltage wideband pulse attenuator of claim 1, wherein the input unit and the output unit include:

a coaxial cable; and a first dielectric layer surrounding the coaxial cable.

11. The high voltage wideband pulse attenuator of claim 10, wherein the coaxial cable includes:

a cable core; and a dielectric layer surrounding the cable core and having a circular step on a surface.

12. The high voltage wideband pulse attenuator of claim 10, wherein the input unit and output unit further include:

a transformation electrode for connecting the coaxial cable with the attenuator circuit or capacitive divider circuit; and a second dielectric layer surrounding the transformation electrode.

* * * * *